(12) United States Patent
Fiedler (10) Patent No.: US 7,437,137 B2
(45) Date of Patent: Oct. 14, 2008

(54) MIXER SYSTEM

(76) Inventor: Alan Fiedler, 8777 Walton Oaks Dr., Bloomington, MN (US) 55438

( * ) Notice: Subject to any disclaimer, the term of this patent is extended or adjusted under 35 U.S.C. 154(b) by 1105 days.

(21) Appl. No.: 10/779,199

(22) Filed: Feb. 13, 2004

(65) Prior Publication Data

US 2004/0160265 A1    Aug. 19, 2004

(51) Int. Cl.
*H04B 1/10*    (2006.01)
(52) U.S. Cl. .................. 455/317; 455/296; 455/333; 375/322; 327/113
(58) Field of Classification Search ........... 455/63.1, 455/67.13, 295, 296, 313, 317, 318, 323, 455/333, 572; 375/322, 324, 327, 346; 327/113, 327/119
See application file for complete search history.

(56) References Cited

U.S. PATENT DOCUMENTS 5,530,928 A * 6/1996 Wheatley et al. ........... 455/318
5,886,547 A * 3/1999 Durec et al. ................ 327/113
6,759,838 B2 * 7/2004 Tao et al. .................... 375/327
7,009,441 B2 * 3/2006 Fiedler ....................... 327/295

* cited by examiner

*Primary Examiner*—Quochien B Vuong
(74) *Attorney, Agent, or Firm*—Briggs and Morgan, P.A.

(57) ABSTRACT

A mixer system includes a multi-phase signal generator, a mixer, and a mixer control circuit. The multi-phase signal generator generates a plurality of mixer input signals, where each has a frequency equal to the others, and a phase, and where the phases are distributed between 0 to 360 degrees. The mixer control circuit generates a plurality of mixer control voltages which are controlled by digital state control input signals. Each mixer control voltage controls the influence of a corresponding mixer input signal on the mixer output signal. In a preferred embodiment, the mixer control voltage is generated by storing a charge on a capacitor, and said charge is increased or decreased through the combined action of the digital state control input signals and the mixer control voltages by means of interconnected mixer control subcircuits. When combined with a data phase detector, the mixer system can be and used within a clock and data recovery system to generate a clock which is phase- and frequency-locked to a serial data stream.

22 Claims, 9 Drawing Sheets

Fig. 9 to minimize VCO phase noise but do not

MIXER SYSTEM

BACKGROUND OF THE INVENTION

Figure 1:
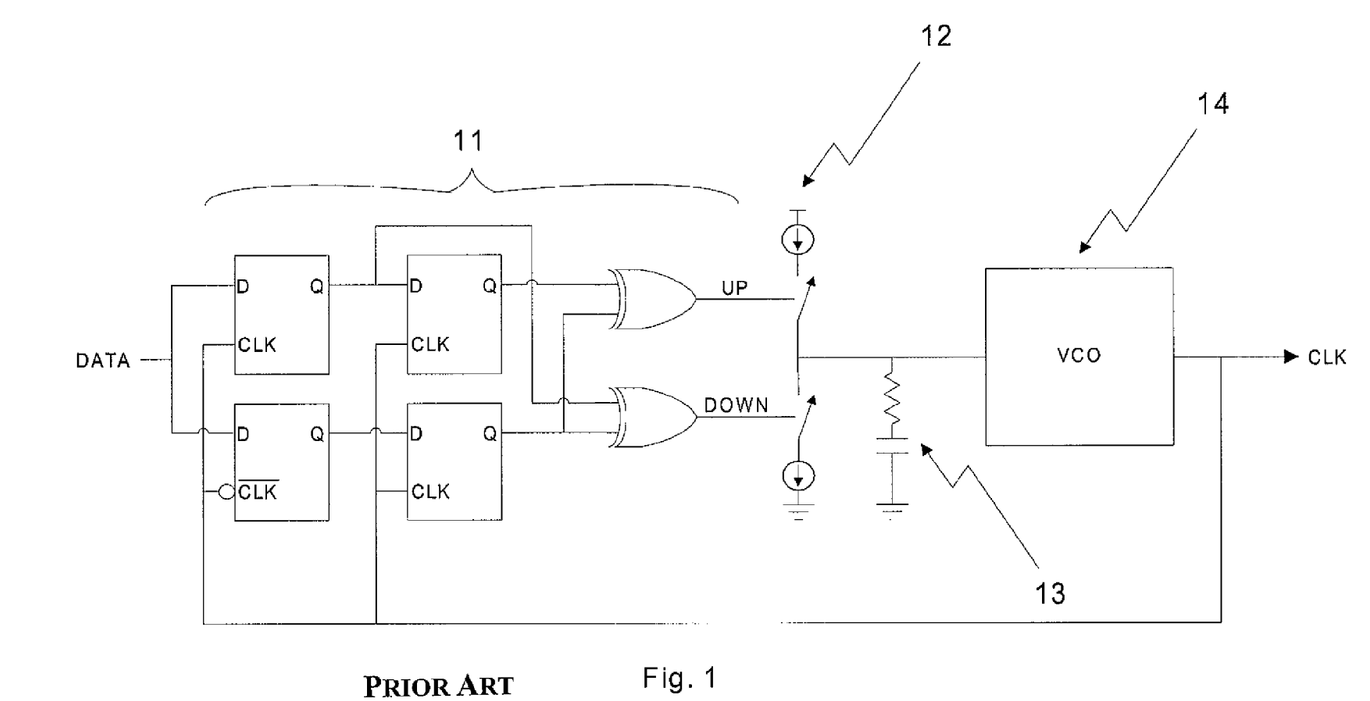
FIG. 1 is a schematic diagram of a traditional system for clock and data recovery of an NRZ data stream.

FIG. 1 illustrates a traditional clock and data recovery system. To generate a signal CLK having a phase and frequency which matches the phase and data rate of DATA, a serial non-return-to-zero (NRZ) data stream, a traditional clock and data recovery system combines in a closed-loop system data phase detector 11, charge pump 12, loop filter 13, and voltage-controlled oscillator (VCO) 14. Within the NRZ data stream, successive "1" logic levels and "0" logic levels are transmitted sequentially, with each logic level held for a period of time called a bit-time. In this system, the data phase detector determines if the falling edge of CLK leads or lags transitions in the NRZ data stream. Data phase detector output signal UP is asserted for one bit-time if the falling edge of CLK lags a data transition; DOWN is asserted for one bit-time if the falling edge of CLK leads a data transition. The UP and DOWN signals are converted to a current by the charge pump and this current is filtered by the loop filter. The filter outputs a voltage which controls the phase and frequency of the VCO. Negative feedback ensures that the feedback loop's steady-state operating point is such that the falling edge of CLK is in phase alignment with transitions in the NRZ data stream, and this ensures that the rising edge of CLK samples the center of each bit-time. The loop filter provides for the addition of a zero in the system's open-loop transfer function, facilitating stability. Additional circuits and methods are used in some embodiments to help ensure that the VCO will oscillate at a frequency equal to the serial data rate, and never at an integer multiple or fraction of the serial data rate. Those skilled in the art will be familiar with these circuits and methods.

A challenge in the design of a system of this type is the design of the VCO and minimizing both its self-generated phase noise and its power-supply-induced phase noise. The feedback nature of the closed-loop system can attenuate this phase noise, but only for phase noise frequencies below the system bandwidth, as set by the loop filter. At frequencies above the system bandwidth, VCO phase noise must be minimized. High-Q LC oscillators, high-power (though low-Q) ring-oscillators, and careful power supply filtering and regulating all can help minimize VCO phase noise but do not eliminate it.

SUMMARY OF THE INVENTION

The function of a mixer system is to perform a weighted sum, or mixing, of two or more input signals, each having a frequency, phase, and amplitude, so as to generate an output signal. In one embodiment, the input signals have the same frequency and amplitude, and the phases of the input signals are distributed between 0 and 360 degrees. Each input signal's influence on the output signal is in proportion to a corresponding weight set by a corresponding mixer control voltage. In a preferred embodiment, the mixer control voltage is generated by storing a charge on a capacitor, and is increased or decreased by increasing or decreasing the charge. Changes in the mixer control voltages are further controlled by the combined action of digital state control input signals and the mixer control voltages by means of interconnected mixer control subcircuits. When combined with a data phase detector, the mixer system can be and used within a clock and data recovery system to generate a clock which is phase- and frequency-locked to a serial data stream.

DETAILED DESCRIPTION OF THE PREFERRED EMBODIMENTS

The invention described herein is a new mixer system which includes electronic components which replace the charge pump, loop filter, and VCO in the traditional clock and data recovery system of FIG. 1.

Figure 2:
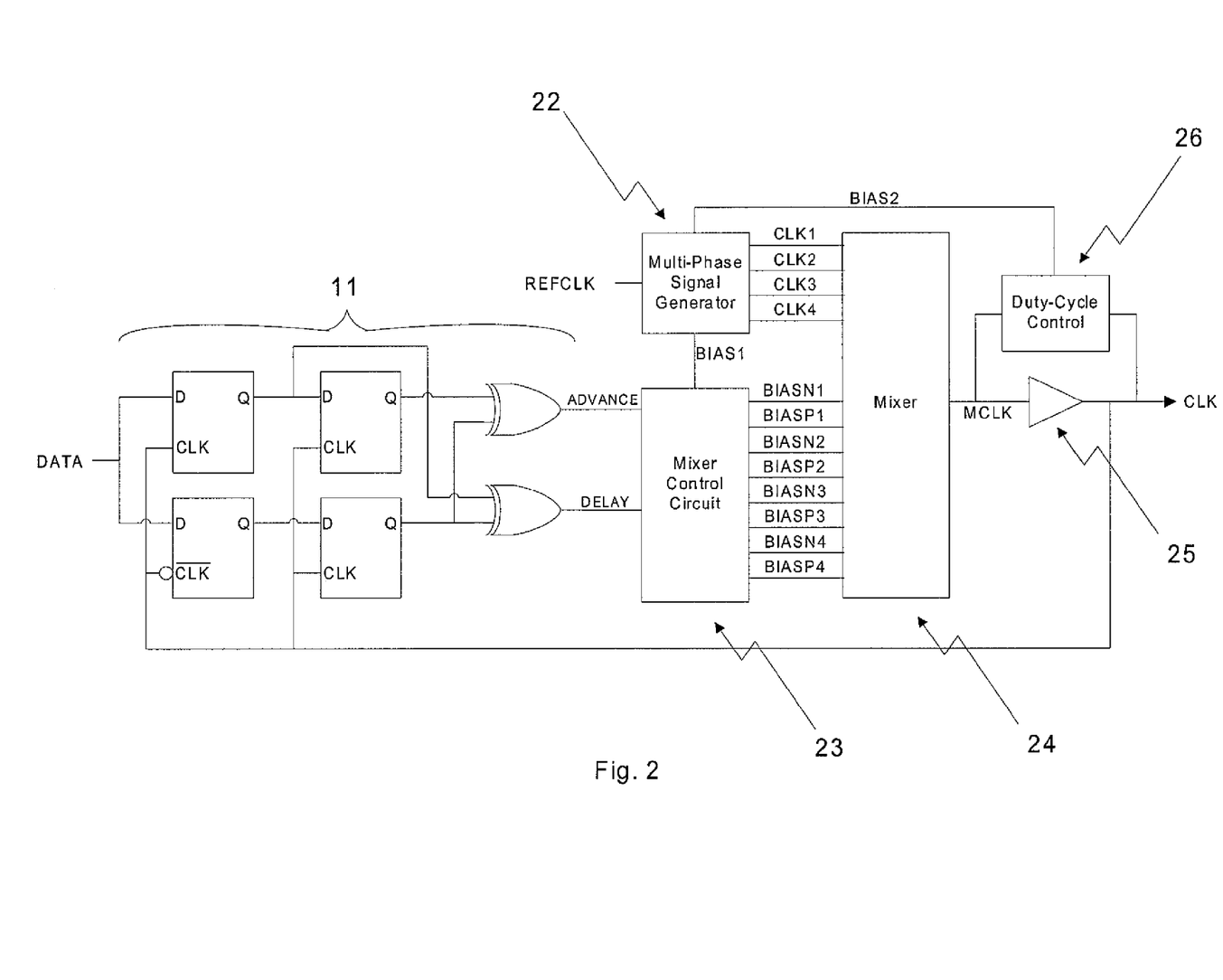
FIG. 2 is a schematic diagram of a modified clock and data recovery system with a mixer system which replaces the charge pump, loop filter, and VCO in the traditional clock and data recovery system of FIG. 1. The mixer system includes a multi-phase signal generator, a mixer control circuit, a mixer, an output buffer, and a duty-cycle control circuit.

FIG. 2 illustrates the new mixer system, with these aforementioned components replaced by multi-phase signal generator 22, mixer control circuit 23, mixer 24, output buffer 25, and duty-cycle control circuit 26. As in the traditional clock and data recovery system, data phase detector 11 determines if the recovered clock CLK leads or lags transitions in the NRZ data stream. Data phase detector output signal ADVANCE is asserted for one bit-time if the falling edge of CLK lags a data transition; DELAY is asserted for one bit-time if the falling edge of CLK leads a data transition. The frequency of input reference clock signal REFCLK is substantially (but not necessarily exactly) equal to the data rate of the NRZ data stream. Stated another way, the period of REFCLK is substantially (but not necessarily exactly) equal to a bit-time of the NRZ data stream.

Multi-phase signal generator 22 generates multi-phase output signals CLKn (n=1,2,3,4) each having a frequency equal to the frequency of input signal REFCLK. The phases of the output signals are distributed between 0 and 360 degrees: defining CLK1 to have a phase of 0 degrees, the relative phase of CLK2 is substantially equal to 90 degrees, the relative phase of CLK3 is substantially equal to 180 degrees, and the relative phase of CLK3 is substantially equal to 270 degrees. Further, the multi-phase signal generator outputs two control currents, BIAS1 and BIAS2, in substantial proportion to the frequency of input signal REFCLK. Control current BIAS1 is a current source used by the mixer control circuit to set mixer bandwidth, and control current BIAS2 is a current sink used by the duty-cycle control circuit to set a current drive strength at its output. The multi-phase signal generator can be constructed from a delay-locked loop, for example. The literature contains numerous examples of circuit topologies which make use of current-controlled delay cells to do this. Additional circuitry generates control currents BIAS1 and BIAS2, each having a magnitude in substantially constant proportion to delay-cell current. Those skilled in the art will readily recognize methods to accomplish this.

Mixer control circuit 23 controls the mixing of signals from the multi-phase signal generator by means of mixer control voltages BIASNn and BIASPn (n=1,2,3,4). Whenever ADVANCE is briefly asserted, the state of the mixer control circuit will shift so as to cause the mixer to generate a mixer output signal MCLK of a slightly earlier phase. Whenever DELAY is briefly asserted, the state of the mixer control circuit will shift so as to cause the mixer to generate a mixer output signal MCLK of a slightly later phase. This is a continuous, analog operation: whenever ADVANCE (or DELAY) is asserted, the mixer control voltages steadily change such that the phase of the MCLK is steadily advanced (or delayed), relative to the phase of the mixer input signals. The data phase detector will assert either ADVANCE or DELAY for one bit-time whenever a data transition occurs. In a preferred embodiment, the phase shift observed in MCLK when either ADVANCE or DELAY is asserted for one bit-time is a small fraction (0.1 or smaller) of the bit-time.

Mixer 24 has an operating frequency and mixes multi-phase input signals CLKn (n=1,2,3,4) so as to generate mixer output signal MCLK whose frequency is the mixer operating frequency and is substantially (but not necessarily exactly) equal to the frequency of the multi-phase input signals. To buffer mixer output signal MCLK, buffer 25 is used, and duty-cycle control circuit 26 ensures that the duty cycle of CLK is substantially equal to 50%.

Negative feedback ensures that CLK will have a substantially constant phase relationship relative to the transitions in the serial NRZ data stream. Specifically, the falling edge of CLK will be in phase with the transitions, and the rising edge of CLK will be in phase with the center of each bit-time. The process of mixing the multi-phase input signals involves converting each input signal to a current, scaling each current by multiplying it by a weight, (as set by control voltage pairs BIASNn and BIASPn; n=1,2,3,4), and summing the scaled currents onto MCLK. The mixer control circuit uses control current BIAS1 from the multi-phase signal generator to scale each weight in equal proportion to the mixer operating frequency, thereby affecting the total current drive onto (and, therefore, the bandwidth of) mixer output terminal MCLK. Best mixer operation is achieved when the bandwidth of MCLK is approximately equal to or slightly higher than the mixer operating frequency.

Figure 3:
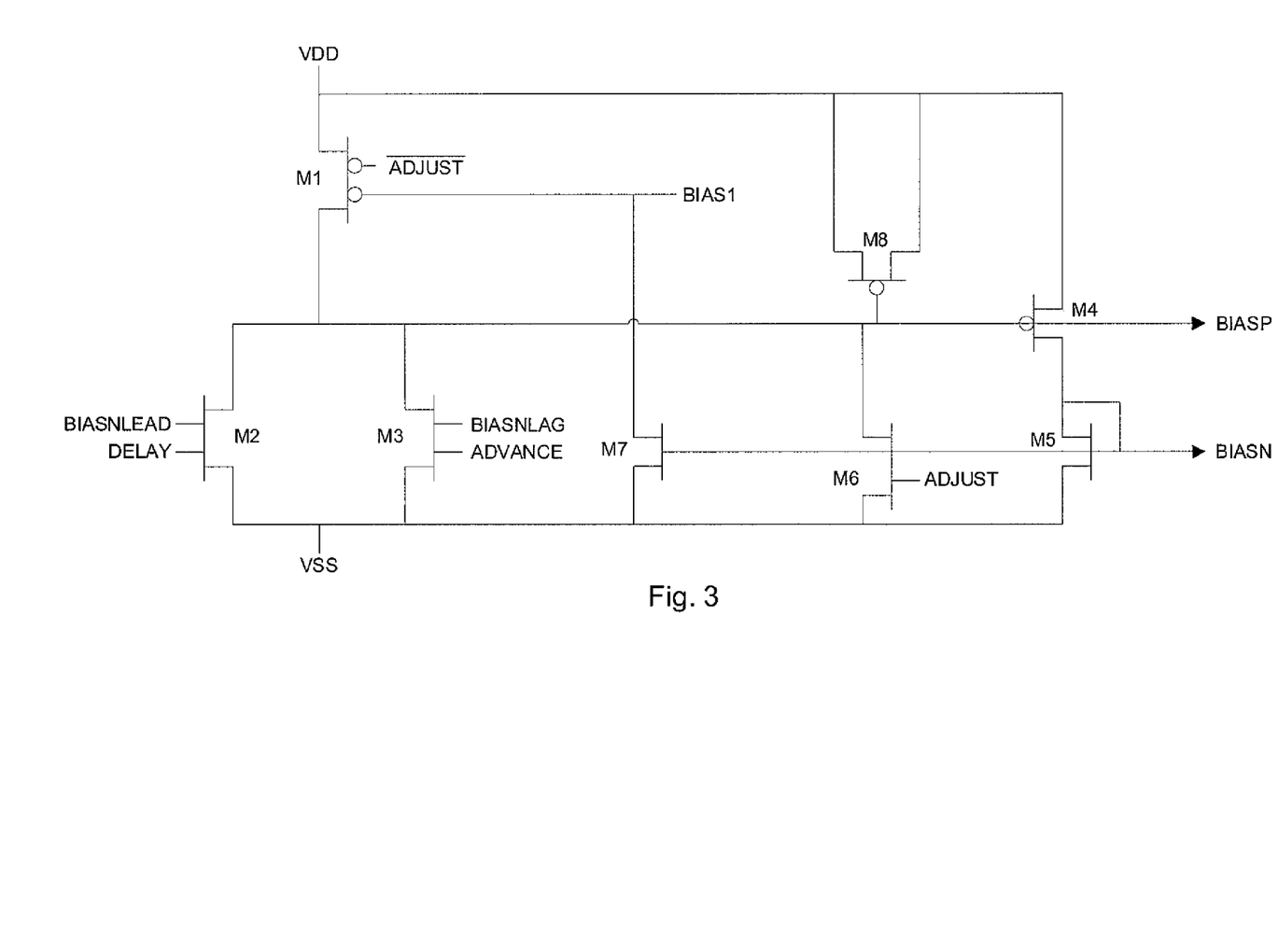
FIG. 3 is a schematic diagram of a mixer control subcircuit.

The mixer control subcircuit, illustrated in FIG. 3, stores and manipulates charge on integration capacitor M8 according to its state control inputs. Inputs BIASNLEAD and BIASNLAG are analog state control input terminals, BIASN and BIASP are mixer control output terminals, BIAS1 is an analog terminal, and inputs ADJUST, /ADJUST, ADVANCE, and DELAY are digital state control input terminals. For proper circuit operation, whenever ADVANCE or DELAY is asserted high, ADJUST is asserted high and /ADJUST is asserted low. When neither ADVANCE nor DELAY is asserted high, ADJUST is de-asserted low and /ADJUST is de-asserted high.

When DELAY is asserted high (and ADJUST is asserted high and /ADJUST is asserted low) for a period of time, M2 conducts current from the integration capacitor to VSS, with the magnitude of this current in accordance with the BIASNLEAD voltage; M1 conducts a current onto the integration capacitor from VDD, with the magnitude of this current in accordance with the BIAS1 voltage; and M6 conducts a current from the integration capacitor to VSS, with the magnitude of this current in accordance with the voltage on BIASN. These three currents are summed and integrated by integration capacitor M8, with an integration time equal to the time DELAY is asserted high.

Similar operation results when ADVANCE is asserted high (and ADJUST is asserted high and /ADJUST is asserted low) for a period of time. In this case, however, rather than M2 in accordance with the BIASNLEAD voltage, M3 conducts a current from the integration capacitor to VSS, with the magnitude of this current in accordance with the BIASNLAG voltage.

Transistor M4 and diode-connected transistor M5 are used to generate a ground-referenced BIASN voltage from the vdd-referenced BIASP voltage. This voltage on the BIASN terminal controls currents through M6 and M7.

Figure 4:
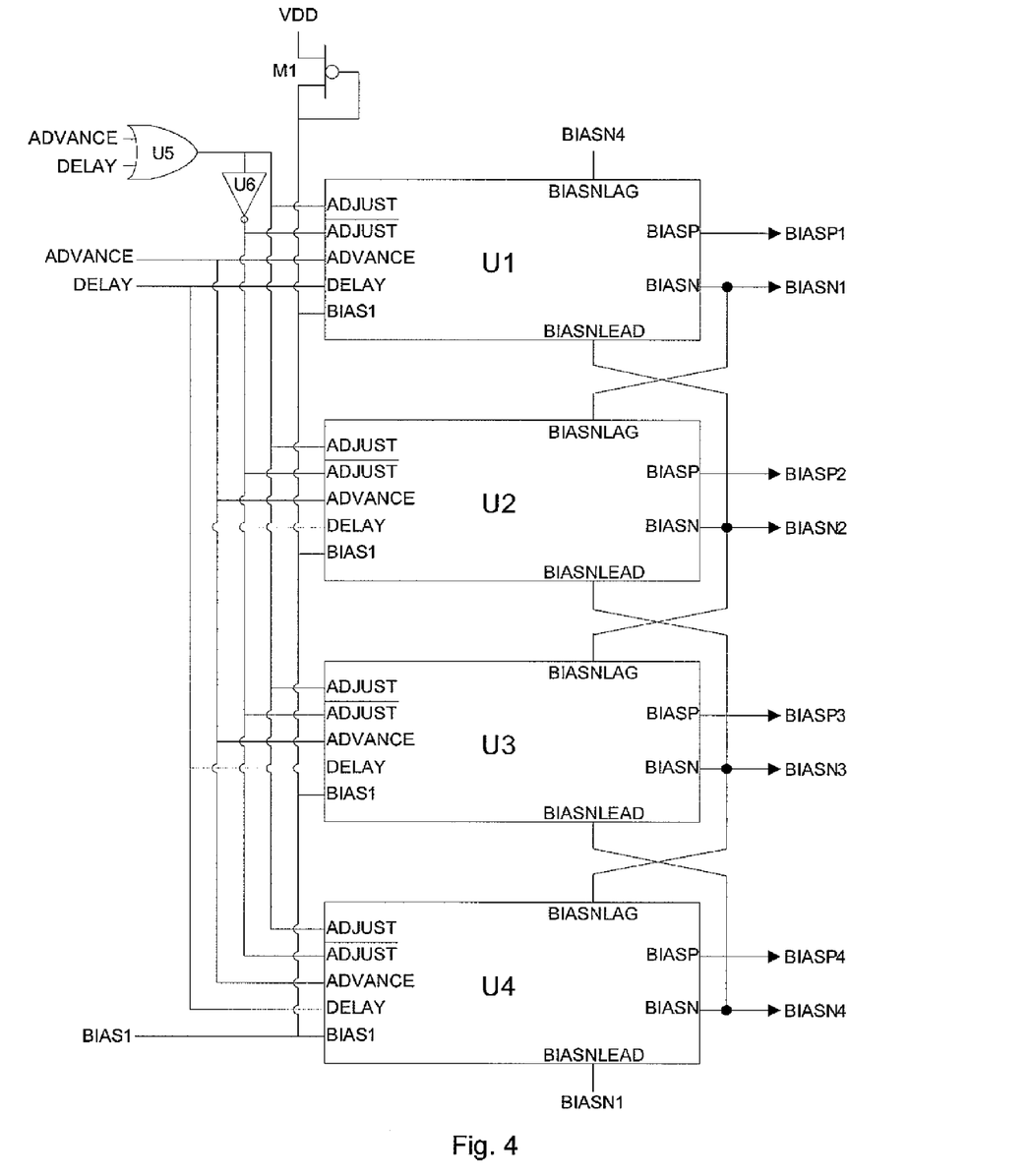
FIG. 4 is a schematic diagram of a mixer control circuit.

An understanding of the operation of the mixer control subcircuit is obtained through consideration of the operation of the mixer control circuit, comprising four interconnected mixer control subcircuits U1, U2, U3, and U4, and diode-connected p-type FET M1, as illustrated in FIG. 4. Here, the ADVANCE input terminals of the four subcircuits are connected together, to an input terminal of OR gate U5, and to input terminal ADVANCE; the DELAY input terminals of the four subcircuits are connected together, to an input terminal of OR gate U5, and to input terminal DELAY; the ADJUST input terminals of the four subcircuits are connected together, to the output terminal of OR gate U5, and to the input terminal of inverter U5; the /ADJUST input terminals of the four subcircuits are connected together and to the output terminal of inverter U5; and the BIAS1 terminals of the four subcircuits are connected together, to input terminal BIAS1, and to the gate and drain terminals of diode-connected transistor M1.

The BIASN terminals of the mixer control subcircuits are interconnected in the following manner: the BIASN terminal of mixer control subcircuit U1 is coupled to the BIASNLAG terminal of mixer control subcircuit U2 and to the BIASNLEAD terminal of mixer control subcircuit U4, the BIASN terminal of mixer control subcircuit U2 is coupled to the BIASNLAG terminal of mixer control subcircuit U3 and to the BIASNLEAD terminal of mixer control subcircuit U1, the BIASN terminal of mixer control subcircuit U3 is coupled to the BIASNLAG terminal of mixer control subcircuit U4 and to the BIASNLEAD terminal of mixer control subcircuit U2, the BIASN terminal of mixer control subcircuit U4 is coupled to the BIASNLAG terminal of mixer control subcircuit U1 and to the BIASNLEAD terminal of mixer control subcircuit U3. Additionally, the BIASN and BIASP terminals of mixer control subcircuit U1 are coupled to output terminals BIASN1 and BIAP1, respectively; the BIASN and BIASP terminals of mixer control subcircuit U2 are coupled to output terminals BIASN2 and BIAP2, respectively, the BIASN and BIASP terminals of mixer control subcircuit U3 are coupled to output terminals BIASN3 and BIAP3, respectively, and the BIASN and BIASP terminals of mixer control subcircuit U4 are coupled to output terminals BIASN4 and BLASP4, respectively.

FIG. 5 illustrates operation of the mixer control circuit of FIG. 4. In FIGS. 5a, 5b, 5c, and 5d, the dark data points illustrate initial exemplary state voltages of the mixer control circuit with ADVANCE and DELAY input terminals held low and control current BIAS1 sourced into the BIAS1 input terminal.

Figure 5A:
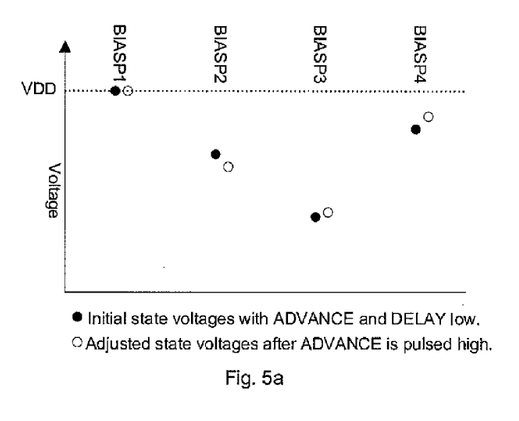
FIG. 5 is an illustration of mixer control circuit operation.
Figure 5B:
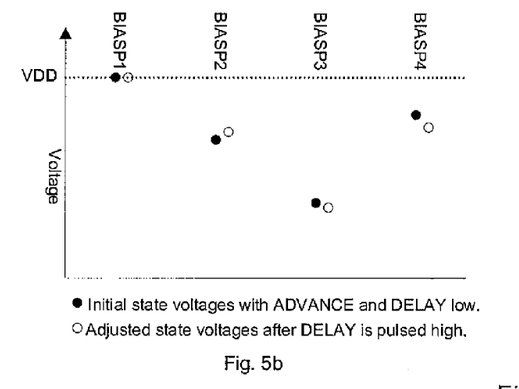

The light data points of FIG. 5a illustrate new exemplary state voltages following a positive pulse of duration equal to one bit-time applied to the ADVANCE input terminal, where the BIASP2 mixer control voltage has decreased and the BIASP3 and BIASP4 mixer control voltages have increased. These shifts in mixer control voltages result in a corresponding advance in phase of MCLK. The light data points of FIG. 5b illustrate new state voltages following a positive pulse of duration equal to one bit-time applied the DELAY input terminal, where the BIASP2 and BIASP3 mixer control voltages have increased and the BIASP4 mixer control voltage has decreased. These shifts in mixer control voltages result in a corresponding delay in phase of the MCLK. An analog feedback loop comprising M1, M4, M5 and M7 of each mixer control subcircuit acts to hold substantially constant the sum of the BIASPn (n=1,2,3,4) voltages while still allowing the individual BIASPn (n=1,2,3,4) voltages to change in response to control signals applied to the ADVANCE and DELAY terminals.

Figure 5C:
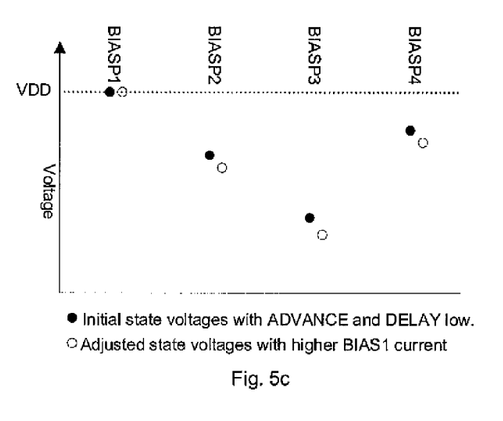
Figure 5D:
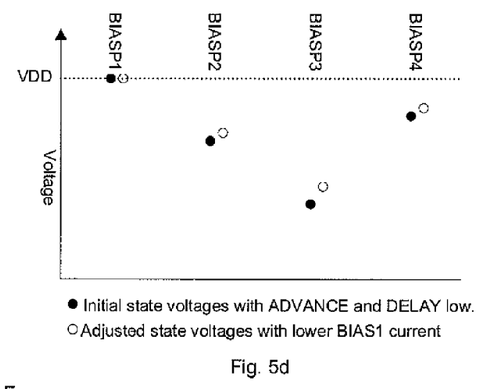

The light data points of FIG. 5c illustrate new state voltages following an increase in the magnitude of control current BIAS1 due to an increase in the mixer system operating frequency. Coupled with a plurality of assertions of the ADVANCE and/or DELAY and /ADJUST input terminals, this current increase then gives rise to an increase in the mixer control voltages BIASP2, and BIASP3, and BIASP4. These shifts in mixer control voltages have two important effects: one is a corresponding increase in available current drive and bandwidth of MCLK; a second is a corresponding increase in available current drive at mixer control terminals BIASPn (n=1,2,3,4). This increase in available current drive at BIASPn is substantially proportional to the increase in the mixer system operating frequency and a subsequent decrease in ADVANCE and DELAY pulse widths. A net result is that a mixer phase shift (measured in degrees) resulting from a single detected transition in the serial NRZ data stream is substantially independent of mixer system operating frequency. FIG. 5d is similar to FIG. 5c, but illustrates the effect of a decrease in magnitude of control current BIAS1.

Figure 6:
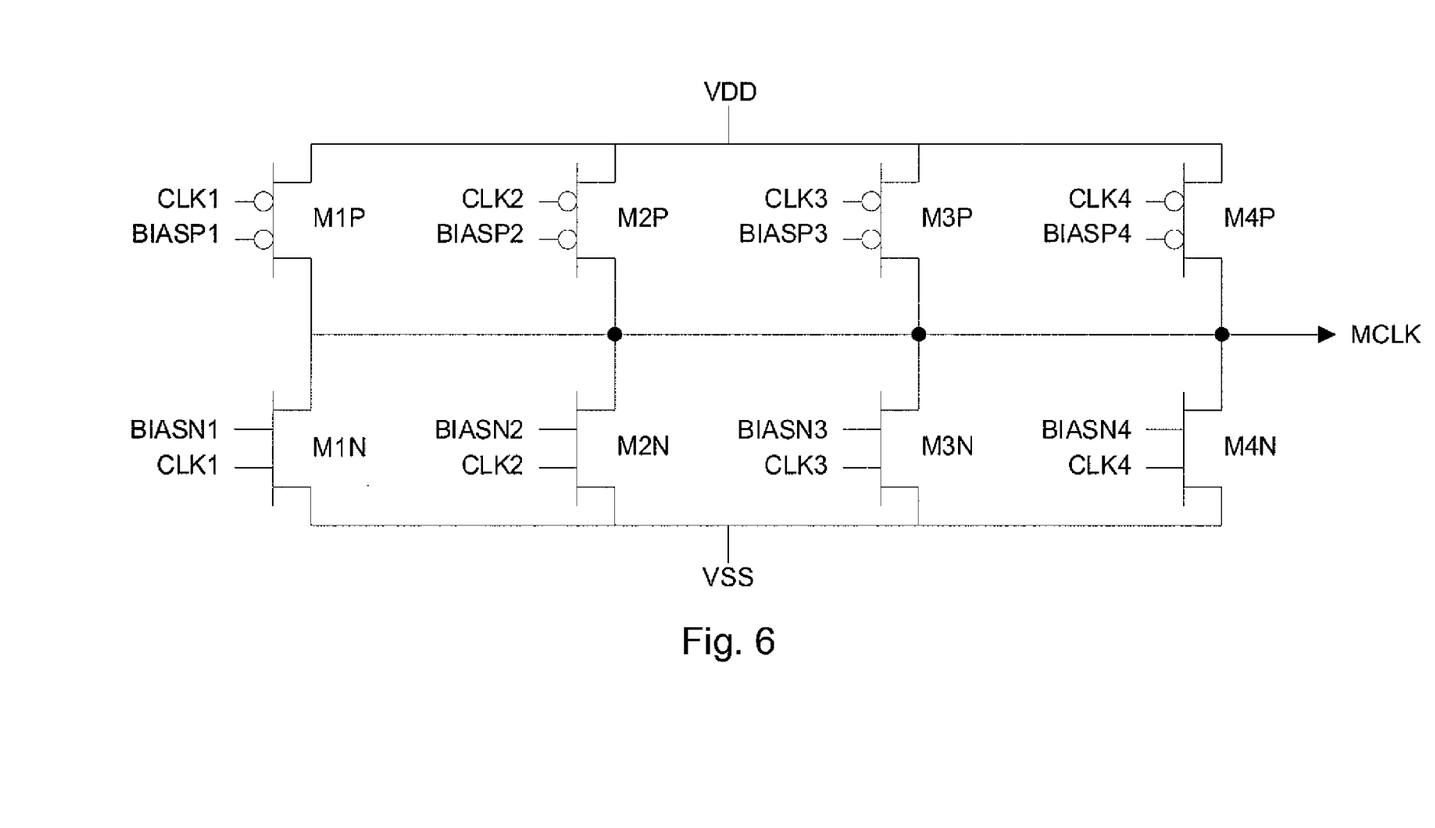
FIG. 6 is a schematic diagram of a mixer.

The mixer control circuit is coupled to the mixer, illustrated in FIG. 6. The mixer is comprised of four pairs of dual-gate transistors M1N and M1P, M2N and M2P, M3N and M3P, and M4N and M4P. Each pair of dual-gate transistors forms a switched voltage-controlled current source and sink controlled by 1) a signal from the multi-phase signal generator to alternately enable the current source and the current sink, and 2) one pair of mixer control signals (of BIASNn and BIASPn; n=1,2,3,4) from the mixer control circuit to control the current sink and current source magnitudes, respectively. Depending on the mixer control voltages, a select subset of mixer input signals CLKn (n=1,2,3,4) influences mixer output signal MCLK to a greater degree than the others. In a preferred embodiment, the mixer control voltages are controlled by the mixer control circuit in such a way that a subset of the input signals substantially influence MCLK, and by adjusting the mixer control voltages, the phase of MCLK is adjusted to any value between 0 and 360 degrees, relative to the phase of one of the mixer input signals.

Mixer bandwidth, as set by the available current drive from the four pairs of dual-gate transistors in FIG. 6 and the total capacitance at mixer output terminal MCLK, is indirectly set by control current BIAS1 from the multi-phase signal generator. In a preferred embodiment, the mixer bandwidth is approximately equal to or slightly higher than its operating frequency. Also in a preferred embodiment, the magnitude of control current BIAS1 is set by the multi-phase signal generator, comprised of a delay-locked loop, for example, operating at the same frequency as the mixer. Those skilled in the art will recognize how to generate control current BIAS1 in proportion to the current used in a current-controlled delay-cell element which is in turn used within the delay-locked loop or phase-locked loop used to generate the mixer input signals. At higher frequencies, control current BIAS1 is larger than at lower frequencies. This results in a higher peak mixer control voltage (i.e., a lower peak BIASPn relative to VDD, and a higher peak BIASNn relative to VSS; n=1,2,3,4) due to feedback action of M3 coupled to the BIAS1 terminal within each of the four mixer control subcircuits. The higher peak mixer control voltage results in increased current drive on MCLK, thereby increasing mixer bandwidth, as desired.

Note that the mixer illustrated here is a single-ended mixer and is exemplary. Other mixer topologies are possible, including a differential mixer. In preferred embodiments, the general topology used in the multi-phase signal generator is the same as that used in the mixer. For example, if the mixer is single-ended, a single-ended multi-phase signal generator is preferable. If the mixer is differential, a differential multi-phase signal generator is preferable.

Three additional components complete the mixer. These are an auto-reset circuit, an output buffer, and a duty-cycle control circuit.

Figure 7:
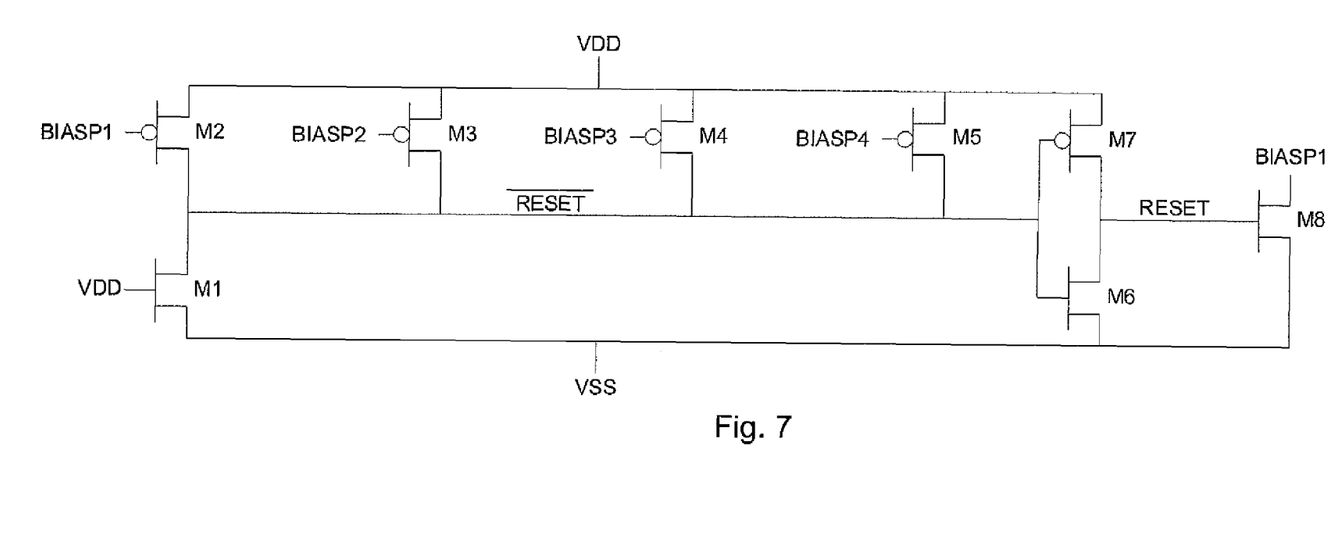
FIG. 7 is a schematic diagram of an auto-reset circuit.

The benefit of the auto-reset circuit arises from the fact that there exists an invalid state from which the mixer control circuit is potentially unable to recover. This invalid state exists when all four BIASPn (n=1,2,3,4) mixer control voltages are at or near VDD. The auto-reset circuit in FIG. 7 detects this condition when none of transistors M2, M3, M4, and M5 are on, and M1 pulls /RESET low. M1 is a long-channel, low-current, n-type FET. Through the action of a logic inverter formed by M6 and M7, this forces RESET high, turning M8 on, and pulling BIASP1 low to VSS. This then turns M2 on, pulling /RESET high, which then results in RESET going low. The detected invalid state is thus successfully cleared, and the auto-reset circuit has no further effect on the mixer control circuit.

Figure 8:
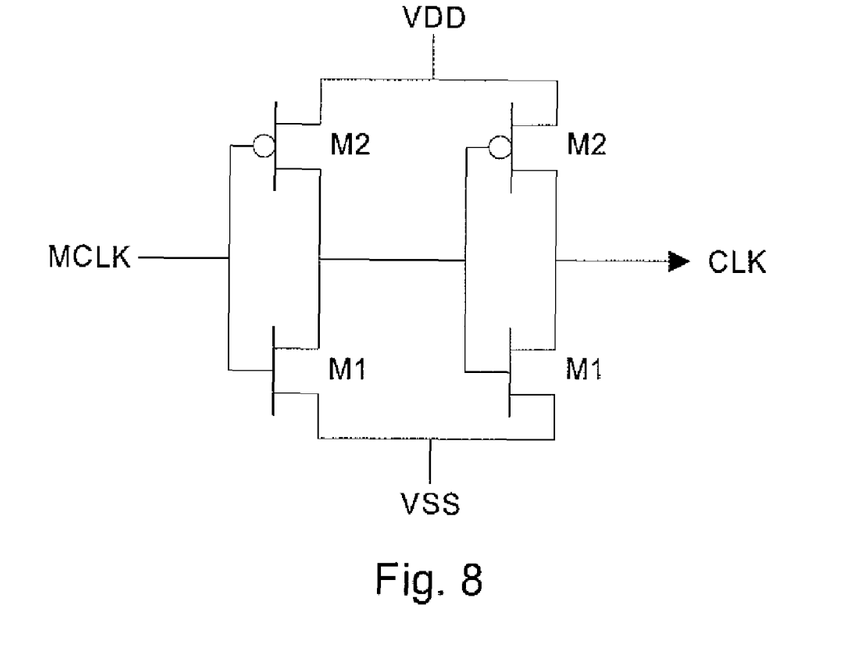
FIG. 8 is a schematic diagram of an output buffer.

The output buffer in FIG. 8 comprises two cascaded inverters, and is used to provide a second mixer output CLK with a stronger current drive, as compared to the current drive at first mixer output MCLK. The output buffer consists of a first inverter, comprising transistors M1 and M2, whose input is coupled to MCLK, and whose output is coupled to a second inverter, comprising transistors M3 and M4. The output of the second inverter is coupled to CLK.

Figure 9:
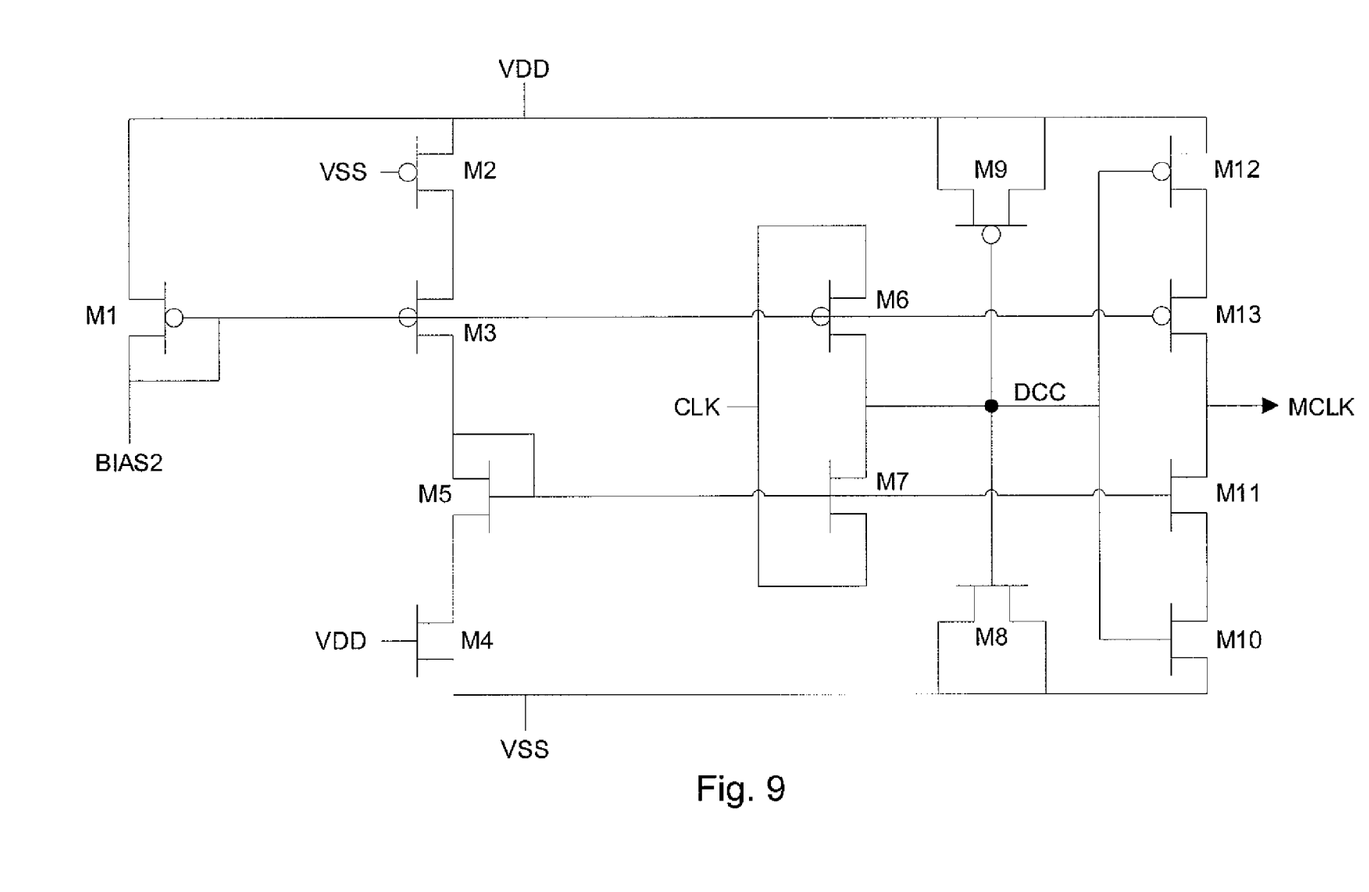
FIG. 9 is a schematic diagram of a duty-cycle control circuit.

The duty-cycle control circuit is shown in FIG. 9. Duty cycle is defined here as the time the periodic signal CLK is a logic high divided by the period of CLK. This is a negative feedback circuit, and by monitoring the duty cycle of CLK and controlling the duty cycle of MCLK, the duty cycle of CLK is forced to be substantially equal to 50%. Coupled to CLK are the source of M6 and the source of M7. M6 and M7 are biased by transistors M1, M2, M3, M4, and M5 so that when M6 and M7 are each on 50% of the time (due to a 50% duty cycle CLK signal), the net current from these transistors onto duty-cycle control node DCC is substantially zero. Biasing of the duty-cycle control circuit is accomplished by means of a control current at input terminal BIAS2. In a preferred embodiment, this control current is a current source which is proportional to the mixer system operating frequency. To further understand the negative feedback mechanism which controls CLK duty cycle, consider the following example:

First assume that the duty cycle of CLK is substantially less than 50%. This results in M6 being on less than 50% of the time, and M7 being on greater than 50% of the time. As a result, the net current from M6 and M7 will tend to reduce the voltage on DCC. Through the action of transistors M1, M1, M12, and M13, this drop in voltage on DCC will result in an increase in the duty cycle of MCLK and, therefore, in the duty cycle of CLK. With appropriate device size choices (e.g., p-type FETs M1, M2, M3, M6, M12, and M13 of equal size, and also n-type FETs M4, M5, M7, M10, M11 of equal size), the circuit will stabilize when the duty cycle of CLK is substantially equal to 50%. Loop stability is enhanced with M8 and M9 acting as loop filter capacitors.

The claims herein describe a mixer system comprising a 4-input mixer coupled to a 4-phase signal generator and a mixer control circuit, and the mixer control circuit comprises four interconnected mixer control subcircuits. In some applications, it may be desirable to mix a different number of input signals. Those skilled in the art will recognize that to mix a larger or smaller number of input signals, the mixer is readily scaled, and the number of interconnected mixer control subcircuits can be increased or decreased to match the change in the number of input signals.

In the claims, first and second control current sources are described. The magnitude of the current generated by each of these current sources is further described as being in proportion to the mixer input frequency. Those skilled in the art will recognize how to use a delay-locked loop to generate these currents.

Gate connections to any of the dual-gate transistors in the figures may be reversed with no loss in functionality, though minor changes in circuit behavior may result.

Except to the extent specified in the following claims, the circuit configurations and device sizes shown herein are provided as examples only. Those skilled in the art will recognize that desired and proper circuit operation can be achieved with other circuit configurations, device sizes, and/or combinations of device sizes.

The mixer can be implemented with discreet components, with semiconductor devices embedded in an integrated circuit such as an application specific integrated circuit (ASIC), or with a combination of both. Individual signals or devices can be active high or low, and corresponding circuitry can be converted or complemented to suit any particular convention. The term "coupled" used in the claims includes various types of connections or couplings and includes a direct connection or a connection through one or more intermediate components.

What is claimed is:

1. A mixer control subcircuit, comprising:
   first and second power supply terminals;
   ADVANCE, DELAY, and /ADJUST digital state control terminals;
   BIASNLAG and BIASNLEAD analog state control terminals;
   a BIASN state output terminal;
   a BIASP node;
   a BIAS1 terminal;
   a first switched current-source comprising a first dual-gate transistor having a drain coupled to the BIASP node, a first gate coupled to the BIAS1 terminal, a second gate coupled to the /ADJUST digital state control terminal, and a source coupled to the second power supply terminal;
   a second switched current-source comprising a second dual-gate transistor having a drain coupled to the BIASP node, a first gate coupled to the BIASNLEAD analog state control terminal, a second gate coupled to the DELAY digital state control terminal, and a source coupled to the first power supply terminal;
   a third switched current-source comprising a third dual-gate transistor having a drain coupled to the BIASP node, a first gate coupled to the BIASNLAG analog state control terminal, a second gate coupled to the ADVANCE digital state control terminal, and a source coupled to the first power supply terminal;
   a first transistor having a drain coupled to the BIASN state output terminal, a gate coupled to the BIASP node, and a source coupled to the second power supply terminal;
   a second transistor having a gate and a drain coupled to the BIASN state output terminal, and a source coupled to the first power supply terminal; and
   a third transistor having a drain coupled to the BIAS1 terminal, a gate coupled to the BIASN state output terminal, and a source coupled to the first power supply terminal.

2. The mixer control subcircuit of claim 1, further comprising:
   a fourth dual-gate transistor having a drain coupled to the BIASP node, a first gate coupled to the BIASN state output terminal, a second gate coupled to an ADJUST digital state control terminal, and a source coupled to the first power supply terminal; and
   a fourth transistor having a gate coupled to the BIASP node, and a drain and a source coupled to the second power supply terminal, so as to improve circuit stability.

3. The mixer control subcircuit of claim 2, further comprising control of the ADJUST digital state control terminals wherein:
   the ADJUST digital state control terminal is set to a logic high level when the /ADJUST digital state control terminal is at a logic low level; and
   the ADJUST digital state control terminal is set to a logic low level when the /ADJUST digital state control terminal is at a logic high level.

4. The mixer control subcircuit of claim 2, wherein the second, third, and fourth dual-gate transistors each further comprise:
   a first transistor having a drain coupled to the BIASP node, a gate coupled to the first gate, and a source; and
   a second transistor having a drain coupled to the source of the first transistor, a gate coupled to the second gate, and a source coupled to the first power supply terminal.

5. The mixer control subcircuit of claim 2, wherein the second, third, and fourth dual-gate transistors each further comprise:
   a first transistor having a drain coupled to the BIASP node, a gate coupled to the second gate, and a source; and
   a second transistor having a drain coupled to the source of the first transistor, a gate coupled to the first gate, and a source coupled to the first power supply terminal.

6. The mixer control subcircuit of claim 1, wherein the first dual-gate transistor further comprises:
   a first transistor having a drain coupled to the BIASP node, a gate coupled to the BIAS1 terminal, and a source; and
   a second transistor having a drain coupled to the source of the first transistor, a gate coupled to the /ADJUST digital state control terminal, and a source coupled to the second power supply terminal.

7. The mixer control subcircuit of claim 1, wherein the first dual-gate transistor further comprises:
   a first transistor having a drain coupled to the BIASP node, a gate coupled to the /ADJUST digital state control terminal, and a source; and
   a second transistor having a drain coupled to the source of the first transistor, a gate coupled to the BIAS1 terminal, and a source coupled to the second power supply terminal.

8. A mixer control circuit, comprising:
   first, second, third, and fourth BIASN mixer control nodes; and
   first, second, third, and fourth mixer control subcircuits, each mixer control subcircuit comprising:
   first and second power supply terminals;
   ADVANCE, DELAY, and /ADJUST digital state control terminals;
   BIASNLAG and BIASNLEAD analog state control terminals;
   a BIASN state output terminal;

a BIASP node;

a BIAS1 terminal;

a first switched current-source comprising a first dual-gate transistor having a drain coupled to the BIASP node, a first gate coupled to the BIAS1 terminal, a second gate coupled to the /ADJUST digital state control terminal, and a source coupled to the second power supply terminal;

a second switched current-source comprising a second dual-gate transistor having a drain coupled to the BIASP node, a first gate coupled to the BIASNLEAD analog state control terminal, a second gate coupled to the DELAY digital state control terminal, and a source coupled to the first power supply terminal;

a third switched current-source comprising a third dual-gate transistor having a drain coupled to the BIASP node, a first gate coupled to the BIASNLAG analog state control terminal, a second gate coupled to the ADVANCE digital state control terminal, and a source coupled to the first power supply terminal;

a first transistor having a drain coupled to the BIASN state output terminal, a gate coupled to the BIASP node, and a source coupled to the second power supply terminal;

a second transistor having a gate and a drain coupled to the BIASN state output terminal, and a source coupled to the first power supply terminal; and a third transistor having a drain coupled to the BIAS 1 terminal, a gate coupled to the BIASN state output terminal, and a source coupled to the first power supply terminal, wherein:

the first mixer control subcircuit's BIASN state output terminal is coupled to the second mixer control subcircuit's BIASNLEAD analog state control terminal, the fourth mixer control subcircuit's BIASNLAG analog state control terminal, and the first BIASN mixer control node;

the second mixer control subcircuit's BIASN state output terminal is coupled to the third mixer control subcircuit's BIASNLEAD analog state control terminal, the first mixer control subcircuit's BIASNLAG analog state control terminal, and the second BIASN mixer control node;

the third mixer control subcircuit's BIASN state output terminal is coupled to the fourth mixer control subcircuit's BIASNLEAD analog state control terminal, the second mixer control subcircuit's BIASNLAG analog state control terminal, and the third BIASN mixer control node;

the fourth mixer control subcircuit's BIASN state output terminal is coupled to the first mixer control subcircuit's BIASNLEAD analog state control terminal, the third mixer control subcircuit's BIASNLAG analog state control terminal, and the fourth BIASN mixer control node;

the first power supply terminals of the first, second, third, and fourth mixer control subcircuits are coupled together;

the second power supply terminals of the first, second, third, and fourth mixer control subcircuits are coupled together;

the BIAS1 terminals of the first, second, third, and fourth mixer control subcircuits are coupled together;

the ADVANCE digital state control terminals of the first, second, third, and fourth mixer control subcircuits are coupled together;

the DELAY digital state control terminals of the first, second, third, and fourth mixer control subcircuits are coupled together; and the /ADJUST digital state control terminals of the first, second, third, and fourth mixer control subcircuits are coupled together.

9. The mixer control circuit of claim 8, further comprising:

a first current source coupled between the BIAS1 terminals and the second power supply terminals; and a transistor having a drain and a gate coupled to the BIAS1 terminals, and a source coupled to the second power supply terminals.

10. The mixer control circuit of claim 9, further comprising:

a first BIASP mixer control node coupled to the first mixer control subcircuit's BIASP node;

a second BIASP mixer control node coupled to the second mixer control subcircuit's BIASP node;

a third BIASP mixer control node coupled to the third mixer control subcircuit's BIASP node; and a fourth BIASP mixer control node coupled to the fourth mixer control subcircuit's BIASP node.

11. A mixer comprising:

the mixer control circuit of claim 10;

first, second, third, and fourth input terminals;

a first output terminal;

a fourth dual-gate transistor having a drain coupled to the BIASP node, a first gate coupled to the BIASN state output terminal, a second gate coupled to an ADJUST digital state control terminal, and a source coupled to the first power supply terminal; a fourth transistor having a gate coupled to the BIASP node, and a drain and a source coupled to the second power supply terminal, so as to improve circuit stability;

a fifth dual-gate transistor having a single drain coupled to the first output terminal, a first gate coupled to the first BIASN mixer control node, a second gate coupled to the first input terminal, and a single source coupled to the first power supply terminals;

a sixth dual-gate transistor having a single drain coupled to the first output terminal, a first gate coupled to the first BIASP mixer control node, a second gate coupled to the first input terminal, and a single source coupled to the second power supply terminals;

a seventh dual-gate transistor having a single drain coupled to the first output terminal, a first gate coupled to the second BIASN mixer control node, a second gate coupled to the second input terminal, and a single source coupled to the first power supply terminals;

an eighth dual-gate transistor having a single drain coupled to the first output terminal, a first gate coupled to the second BIASP mixer control node, a second gate coupled to the second input terminal, and a single source coupled to the second power supply terminals;

a ninth dual-gate transistor having a single drain coupled to the first output terminal, a first gate coupled to the third BIASN mixer control node, a second gate coupled to the third input terminal, and a single source coupled to the first power supply terminals;

a tenth dual-gate transistor having a single drain coupled to the first output terminal, a first gate coupled to the third BIASP mixer control node, a second gate coupled to the third input terminal, and a single source coupled to the second power supply terminals;

an eleventh dual-gate transistor having a single drain coupled to the first output terminal, a first gate coupled to the fourth BIASN mixer control node, a second gate coupled to the fourth input terminal, and a single source coupled to the first power supply terminals; and a twelfth dual-gate transistor having a single drain coupled to the first output terminal, a first gate coupled to the fourth BIASP mixer control node, a second gate coupled to the fourth input terminal, and a single source coupled to the second power supply terminals.

12. The mixer of claim 11, further comprising:
a first input signal coupled to the first input terminal;
a second input signal coupled to the second input terminal;
a third input signal coupled to the third input terminal; and
a fourth input signal coupled to the fourth input terminal.

13. The mixer of claim 12, wherein:
the first input signal has a first input phase;
the second input signal has a second input phase;
the third input signal has a third input phase;
the fourth input signal has a fourth input phase;
the magnitude of the first, second, third, and fourth input phases are distributed between 0 and 360 degrees;
the second input phase is greater than the first input phase;
the third input phase is greater than the second input phase;
the fourth input phase is greater than the third input phase;
the first, second, third, and fourth input signals have an input frequency; and
the first output terminal exhibits an output signal having an output phase, as measured relative to one of the input signals, and an output frequency.

14. The mixer of claim 13, wherein a current generated by the first current source has a variable magnitude, and the variable magnitude is proportional to the input frequency.

15. The mixer of claim 14, wherein:
the output phase and the output frequency are controlled by the ADVANCE, DELAY, and /ADJUST digital state control terminals;
the output phase decreases and the output frequency is greater than the input frequency when the ADVANCE digital state control terminal is at a logic high level, the DELAY digital state control terminal is at a logic low level, and the /ADJUST digital state control terminal is at a logic low level;
the output phase increases and the output frequency is less than the input frequency when the ADVANCE digital state control terminal is at a logic low level, the DELAY digital state control terminal is at a logic high level, and the /ADJUST digital state control terminal is at a logic low level; and
the output phase is substantially constant and the output frequency is substantially equal to the input frequency when the ADVANCE digital state control terminal and the DELAY digital state control terminal are each at a logic low level, and the /ADJUST digital state control terminal is at a logic high level.

16. The mixer of claim 15, further comprising:
an output buffer;
an auto-reset circuit; and
a duty-cycle control circuit.

17. The mixer of claim 16, wherein the output buffer comprises:
a second output terminal;
a first transistor having a drain, a gate coupled to the first output terminal, and a source coupled to the first power supply terminals;
a second transistor having a drain coupled to the drain of the first transistor, a gate coupled to the first output terminal, and a source coupled to the second power supply terminals;

a third transistor having a drain coupled to the second output terminal, a gate coupled to the drain of the first transistor, and a source coupled to the first power supply terminals; and a fourth transistor having a drain coupled to the second output terminal, a gate coupled to the drain of the first transistor, and a source coupled to the second power supply terminals.

18. The mixer of claim 16, wherein the auto-reset circuit comprises:
a first transistor having a drain, a gate coupled to the second power supply terminals, and a source coupled to the first power supply terminals;
a second transistor having a drain coupled to the drain of the first transistor, a gate coupled to the first BIASP mixer control node, and a source coupled to the second power supply terminals;
a third transistor having a drain coupled to the drain of the first transistor, a gate coupled to the second BIASP mixer control node, and a source coupled to the second power supply terminals;
a fourth transistor having a drain coupled to the drain of the first transistor, a gate coupled to the third BIASP mixer control node, and a source coupled to the second power supply terminals;
a fifth transistor having a drain coupled to the drain of the first transistor, a gate coupled to the fourth BIASP mixer control node, and a source coupled to the second power supply terminals;
a sixth transistor having a drain, a gate coupled to the drain of the first transistor, and a source coupled to the first power supply terminals;
a seventh transistor having a drain coupled to the drain of the sixth transistor, a gate coupled to the drain of the first transistor, and a source coupled to the second power supply terminals; and
an eighth transistor having a drain coupled to one of the BIASP mixer control nodes, a gate coupled to the drain of the sixth transistor, and a source coupled to the first power supply terminals.

19. The mixer of claim 16, wherein the duty-cycle control circuit comprises:
a second current source coupled between a BIASP bias node and the first power supply terminals;
a first transistor having a drain and a gate coupled to the BIASP bias node and a source coupled to the second power supply terminals;
a second transistor having a drain, a gate coupled to the first power supply terminals, and a source coupled to the second power supply terminals;
a third transistor having a drain coupled to a BIASN bias node, a gate coupled to the BIASP bias node, and a source coupled to the drain of the second transistor;
a fourth transistor having a drain, a gate coupled to the second power supply terminals, and a source coupled to the first power supply terminals;
a fifth transistor having a drain and a gate coupled to the BIASN bias node, and a source coupled to the drain of the fourth transistor;
a sixth transistor having a drain coupled to a duty-cycle control node, a gate coupled to the BIASP bias node, and a source coupled to the second output terminal;
a seventh transistor having a drain coupled to the duty-cycle control node, a gate coupled to the BIASN bias node, and a source coupled to the second output terminal;

an eighth transistor having a gate coupled to the duty-cycle control node, and a source and drain coupled to the first power supply terminals;

a ninth transistor having a gate coupled to the duty-cycle control node, and a source and drain coupled to the second power supply terminals;

a tenth transistor having a drain, a gate coupled to the duty-cycle control node, and a source coupled to the first power supply terminals;

an eleventh transistor having a drain coupled to the first output terminal, a gate coupled to the BIASN bias node, and a source coupled to the drain of the tenth transistor;

a twelfth transistor having a drain, a gate coupled to the duty-cycle control node, and a source coupled to the second power supply terminals; and a thirteenth transistor having a drain coupled to the first output terminal, a gate coupled to the BIASP bias node, and a source coupled to the drain of the twelfth transistor.

20. The mixer of claim 19, wherein the current generated by the second current source has a variable magnitude, and the variable magnitude is proportional to the input frequency.

21. The mixer of claim 11, wherein the fifth, sixth, seventh, eighth, ninth, tenth, eleventh, and twelfth dual-gate transistors each further comprise:

a first transistor having a drain coupled to the single drain, a gate coupled to the first gate, and a source; and a second transistor having a drain coupled to the source of the first transistor, a gate coupled to the second gate, and a source coupled to the single source.

22. The mixer of claim 11, wherein the fifth, sixth, seventh, eighth, ninth, tenth, eleventh, and twelfth dual-gate transistors each further comprise:

a first transistor having a drain coupled to the single drain, a gate coupled to the second gate, and a source; and a second transistor having a drain coupled to the source of the first transistor, a gate coupled to the first gate, and a source coupled to the single source.

* * * * *